(12) United States Patent
Dampney

(10) Patent No.: US 10,045,460 B2
(45) Date of Patent: Aug. 7, 2018

(54) ELECTRONIC RACK AND MOUNTING CHASSIS

(71) Applicant: CP CASES LIMITED, Isleworth Middlesex (GB)

(72) Inventor: Ian Dampney, Hounslow Middlesex (GB)

(73) Assignee: CP Cases Limited, Isleworth, Middlesex (GB)

( * ) Notice: Subject to any disclaimer, the term of this patent is extended or adjusted under 35 U.S.C. 154(b) by 0 days.

(21) Appl. No.: 15/508,464

(22) PCT Filed: Aug. 26, 2015

(86) PCT No.: PCT/GB2015/052459
§ 371 (c)(1),
(2) Date: Mar. 2, 2017

(87) PCT Pub. No.: WO2016/034852
PCT Pub. Date: Mar. 10, 2016

(65) Prior Publication Data
US 2017/0280584 A1    Sep. 28, 2017

(30) Foreign Application Priority Data
Sep. 2, 2014   (GB) .................................. 1415512.1

(51) Int. Cl.
*H05K 7/18*    (2006.01)
*H02B 1/01*    (2006.01)

(52) U.S. Cl.
CPC .............. *H05K 7/183* (2013.01); *H02B 1/01* (2013.01); *H02B 1/012* (2013.01); *H02B 1/013* (2013.01); *H02B 1/014* (2013.01)

(58) Field of Classification Search
CPC .......... H05K 7/183; H02B 1/01; H02B 1/014; H02B 1/012; H02B 1/013
USPC ................................ 312/265.4, 223.1, 223.2
See application file for complete search history.

(56) References Cited

U.S. PATENT DOCUMENTS

| | | | | |
|---|---|---|---|---|
| 3,639,709 A | * | 2/1972 | Hart .................... | H01R 25/142 200/51 R |
| 4,002,261 A | * | 1/1977 | Litchfield ............... | F16B 12/02 220/4.33 |
| 4,468,067 A | * | 8/1984 | Jenkins ................... | F16B 12/32 312/111 |
| 4,768,845 A | * | 9/1988 | Yeh .................... | A47B 47/0008 312/257.1 |
| 4,954,007 A | | 9/1990 | Pinney | |

(Continued)

FOREIGN PATENT DOCUMENTS

| | | |
|---|---|---|
| DE | 1962561 A | 5/1971 |
| DE | 2731328 A | 2/1979 |

(Continued)

*Primary Examiner* — Brent W Herring
(74) *Attorney, Agent, or Firm* — Andrew W. Chu; Craft Chu PLLC

(57) ABSTRACT

The electronic rack and mounting chassis includes a plurality of horizontal chassis members, a plurality of vertical chassis members, and a plurality of front to back chassis members. The front to back chassis members are each connectable to at least one horizontal chassis member and at least one vertical chassis member, and the front to back chassis members each comprise a hollow section extrusion.

17 Claims, 7 Drawing Sheets

(56) References Cited

U.S. PATENT DOCUMENTS

| | | | | |
|---|---|---|---|---|
| 4,998,636 A * | 3/1991 | Hardigg | | B65D 81/07 |
| | | | | 220/4.34 |
| 5,202,818 A | 4/1993 | Betsch et al. | | |
| 5,326,162 A * | 7/1994 | Bovermann | | H02L 31/30 |
| | | | | 312/265.3 |
| 5,806,946 A * | 9/1998 | Benner | | H02B 1/301 |
| | | | | 312/265.3 |
| 5,873,480 A * | 2/1999 | Wells, Jr. | | H05K 7/183 |
| | | | | 220/4.02 |
| 6,217,138 B1 * | 4/2001 | Benner | | H02L 31/01 |
| | | | | 211/182 |
| D454,692 S * | 3/2002 | Bublitz | | D3/318 |
| 6,428,127 B1 * | 8/2002 | Rasmussen | | A47B 47/0008 |
| | | | | 312/265.4 |
| 6,547,127 B2 | 4/2003 | Bradford | | B65D 5/0055 |
| | | | | 220/4.28 |
| 6,561,603 B2 * | 5/2003 | Knab | | H02B 1/01 |
| | | | | 211/183 |
| 6,634,512 B2 * | 10/2003 | Knab | | H02B 1/01 |
| | | | | 211/189 |
| 6,796,623 B1 * | 9/2004 | Fontana | | H02B 1/01 |
| | | | | 211/26 |
| 6,808,240 B2 * | 10/2004 | Altena | | H02B 1/01 |
| | | | | 312/223.1 |
| 6,965,075 B2 * | 11/2005 | Suzuki | | H02B 1/01 |
| | | | | 174/50 |
| 7,690,629 B1 * | 4/2010 | Briggs | | E04H 17/1413 |
| | | | | 256/21 |
| 7,896,177 B1 * | 3/2011 | Toma | | A47B 47/0008 |
| | | | | 108/147.17 |
| 8,056,235 B1 * | 11/2011 | Briggs | | E04H 17/1413 |
| | | | | 256/65.12 |
| 8,104,626 B2 * | 1/2012 | Huang | | H05K 7/1489 |
| | | | | 211/26 |
| 8,297,450 B2 * | 10/2012 | Zavidniak | | H05K 7/183 |
| | | | | 211/13.1 |
| 8,403,431 B2 * | 3/2013 | Elkins | | H05K 7/186 |
| | | | | 211/26 |
| 8,616,661 B2 * | 12/2013 | Takata | | H02B 1/28 |
| | | | | 174/50 |
| 9,307,836 B2 * | 4/2016 | Arflack | | A47B 55/00 |
| 9,814,156 B2 * | 11/2017 | Wilson | | H05K 7/1489 |
| 2001/0037988 A1 * | 11/2001 | Knab | | H02B 1/01 |
| | | | | 211/189 |
| 2001/0038260 A1 * | 11/2001 | Knab | | H02B 1/01 |
| | | | | 312/265.4 |
| 2002/0079359 A1 * | 6/2002 | Bradford | | B65D 5/0055 |
| | | | | 229/199 |
| 2002/0121387 A1 * | 9/2002 | Suzuki | | H02B 1/01 |
| | | | | 174/50 |
| 2003/0048048 A1 * | 3/2003 | Altena | | H02B 1/01 |
| | | | | 312/265.4 |
| 2009/0114785 A1 * | 5/2009 | Huang | | A47B 88/43 |
| | | | | 248/220.31 |
| 2009/0178821 A1 * | 7/2009 | Zavidniak | | H05K 7/183 |
| | | | | 174/51 |
| 2013/0146321 A1 * | 6/2013 | Takata | | H02B 1/28 |
| | | | | 174/50 |
| 2014/0076601 A1 * | 3/2014 | Takata | | H02B 1/28 |
| | | | | 174/50 |
| 2017/0094827 A1 * | 3/2017 | Wilson | | H05K 7/1489 |
| 2017/0150636 A1 * | 5/2017 | Segroves | | H05K 7/1489 |

FOREIGN PATENT DOCUMENTS

| | | |
|---|---|---|
| EP | 0281983 A | 9/1988 |
| EP | 1 196 972 A1 | 4/2002 |
| EP | 1 235 321 A1 | 8/2002 |
| FR | 2 432 638 A1 | 2/1980 |
| FR | 2796519 A | 1/2001 |
| FR | 2 839 209 A1 | 10/2003 |
| WO | 01 91529 A | 11/2001 |

\* cited by examiner

ELECTRONIC RACK AND MOUNTING CHASSIS

CROSS-REFERENCE TO RELATED APPLICATIONS

See Application Data Sheet.

STATEMENT REGARDING FEDERALLY SPONSORED RESEARCH OR DEVELOPMENT

Not applicable.

THE NAMES OF PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

1. Field of the Invention

The present disclosure relates to an electronic rack and mounting chassis, to a fastening means suitable for use therewith, and to a container comprising the electronic rack and mounting chassis.

2. Description of Related Art Including Information Disclosed Under 37 CFR 1.97 and 37 CFR 1.98.

Portable containers provided with electronic rack and mounting chassis for the mounting of sensitive electronic apparatus are well known; these generally comprise a rigid outer casing within which the rack and mounting chassis is mounted via anti-vibration mounts. The mounted apparatus may be safely stored and transported in the container and remains in the container during use.

BRIEF SUMMARY OF THE INVENTION

The present invention arose in a bid to provide an improved electronic rack and mounting chassis.

According to the present invention in a first aspect, there is provided an electronic rack and mounting chassis recited by Claim 1.

According to the present invention in a further aspect, there is provided an electronic rack and mounting chassis comprising: a plurality of horizontal chassis members, a plurality of vertical chassis members, and a plurality of front to back chassis members, wherein the front to back chassis members are each connectable to at least one horizontal chassis member and at least one vertical chassis member, and the front to back chassis members each comprise a hollow section extrusion.

Each front to back chassis member may be directly connectable with at least one vertical chassis member and at least one horizontal chassis member.

The front to back chassis members may each comprise a horizontal channel and a vertical channel that extend along the direction of a longitudinal axis of the front to back chassis members.

The horizontal channel may be arranged to receive an end of the at least one horizontal chassis member and the vertical channel may be arranged to receive an end portion of the at least one vertical chassis member.

According to the present invention in a further aspect, there is provided an electronic rack and mounting chassis comprising: a plurality of horizontal chassis members, a plurality of vertical chassis members, and a plurality of front to back chassis members, wherein the front to back chassis members are each connectable to at least one horizontal chassis member and at least one vertical chassis member, wherein an interlocking connection is provided between each front to back chassis member and the at least one vertical chassis member connectable thereto and/or between each front to back chassis member and the at least one horizontal chassis member connectable thereto, and wherein the interlocking connection is arranged to permit movement of the at least one vertical chassis member and/or the at least one horizontal chassis member relative to the front to back chassis member in a single axis only.

According to the present invention in a further aspect, there is provided an electronic rack and mounting chassis comprising: a plurality of horizontal chassis members, a plurality of vertical chassis members, and a plurality of front to back chassis members, wherein the front to back chassis members are each connectable to at least one horizontal chassis member and at least one vertical chassis member, wherein the vertical chassis members each comprise a plurality of holes for receiving fasteners for the fastening of equipment to the chassis, and one or more fasteners are provided which each comprise a nut that is provided with a first portion, which has a dimension greater than the diameter of the hole that the nut is received by, a second portion, which has a smaller diameter than the hole and extends therethrough, and a locking member, which has a dimension greater than the hole and is engageable with the second portion, so as to lock the nut in the hole.

There may be provided a container comprising an electronic rack and mounting chassis as defined in the preceding paragraphs.

According to the present invention in another aspect, there is provided a fastening means comprising a nut that is provided with a first portion, which has a dimension greater than a second portion of the nut; and a locking member, which has a dimension greater than the second portion and is engageable with the second portion.

The fastening means may be received, in use, within a through hole in a member, wherein the first portion has a dimension greater than the diameter of the hole, the second portion has a smaller diameter than the hole, and the locking member has a dimension greater than the hole to lock the nut in the hole. The spacing between the locking member and the first member in an axial direction of the nut may be substantially equal to the thickness of the member.

Further, preferable, features are presented in the dependent claims.

BRIEF DESCRIPTION OF THE SEVERAL VIEWS OF THE DRAWINGS

Non-limiting embodiments will now be described, by way of example only, with reference to the accompanying drawings.

DETAILED DESCRIPTION OF THE INVENTION

Figure 1:
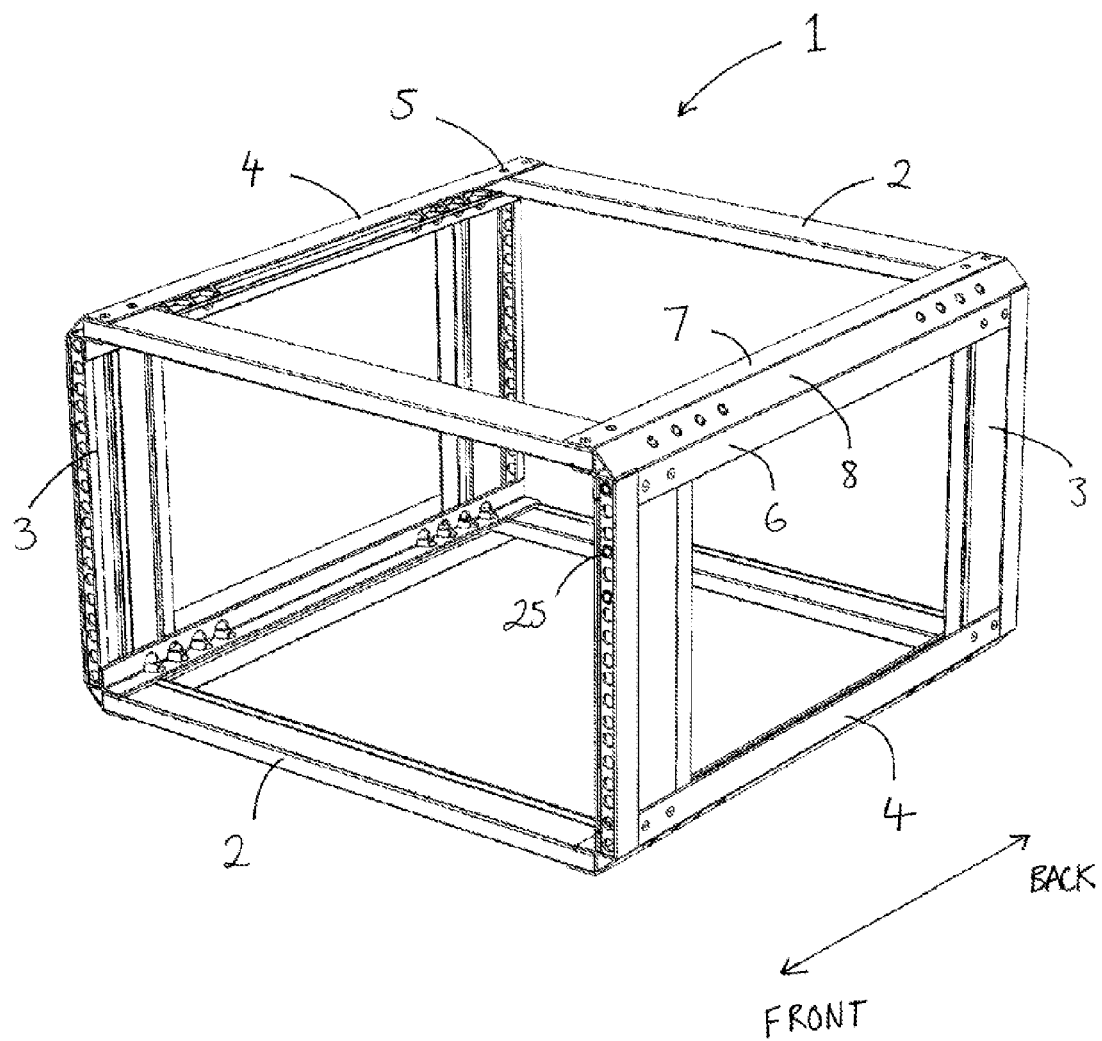
FIG. 1 shows an electronic rack and mounting chassis according to a first embodiment in perspective view.

With reference to FIG. 1, there is shown an electronic rack and mounting chassis 1 in accordance with the present invention. The electronic rack and mounting chassis 1 is provided for mounting within a suitably sized rigid outer container via anti-vibration mounts. Suitable containers include rigid plastic or metal containers which substantially comprise a box with four walls, which extend in a front to back direction, the box comprising an opening at one or both of its ends, wherein the or each open end is closed using a removable lid. By removal of the or each lid, electronic equipment mounted in the rack and mounting chassis may be accessed. Suitable plastic containers may be rotationally moulded. A range of chassis sizes will be available for a range of container sizes. The electronic rack and mounting chassis preferably complies to the universal 19 inch rack standard. The width of the chassis may remain constant whilst the height and/or the depth of the chassis is varied for different containers/equipment.

The chassis 1 comprises a plurality of horizontal chassis members 2, a plurality of vertical chassis members 3, and a plurality of front to back chassis members 4. In the present arrangement, there are four horizontal chassis members 2, four vertical chassis members 3 and four front to back chassis members 4. In the assembled state, as shown, the front to back chassis members are each connected to two horizontal chassis members and two vertical chassis members, with a vertical chassis member and horizontal chassis member attached to each of the opposed ends of each front to back chassis members. The chassis comprises a square or rectangular three dimensional frame with a horizontal chassis member, a vertical chassis member and a front to back chassis member joined to one another at each of the eight vertices thereof.

Uniquely, the front to back chassis members 4 comprise hollow section extrusions. It is preferable, as shown, that the horizontal chassis members 2 and the vertical chassis members 3 also comprise hollow section extrusions. The chassis members may be extruded from high tensile strength aluminium, or from any alternative suitably strong/rigid material. The use of hollow section extrusions for the chassis members provides significant rigidity to the chassis 1. Most preferably, the hollow section extrusions each comprise one or more hollow triangular sections, as shown. The hollow sections are closed along their lengths.

The horizontal chassis members 2 and the vertical chassis members 3 are most preferably directly connectable to the front to back chassis members 4, as shown. As seen most clearly in FIGS. 2 to 4, interlocking connections may be provided between the front to back chassis members 4 and the horizontal chassis members 2 and between the front to back chassis members 4 and the vertical chassis members 3, wherein prior to the introduction of any fastening means, a self-supporting structure is provided. In this self-supporting structure, the horizontal chassis members 2 and the vertical chassis members 3 are constrained from all movement other than translational movement (i.e. movement whilst their orientations are fixed) in the direction of the longitudinal axes of the front to back chassis members (the back to front direction of the chassis in FIG. 1). By the introduction of fasteners 5, as discussed below, this movement is prevented and a rigid secured chassis is provided.

The chassis members and the interlocking connections therebetween will now be considered in more detail.

Each of the front to back chassis members 4 comprises a hollow section extrusion. In the present arrangement, a single triangular hollow section 10 is provided. In alternative arrangements, however, the profile may be modified to include additional and/or alternate hollow sections.

The front to back chassis members 4 each comprise an outer vertical front to back wall 6, an outer horizontal front to back wall 7 and an angled front to back wall 8, which extends therebetween. The outer front to back walls define outer front to back faces of the front to back chassis members 4, which extend in the direction of the longitudinal axes of the front to back chassis members. The angled front to back wall 8 of the present arrangement provides an outer front to back wall/face of the triangular hollow section, which is provided at an oblique angle to each of the vertical and horizontal front to back walls/faces, most preferably at an angle of 45 degrees thereto.

Figure 2:
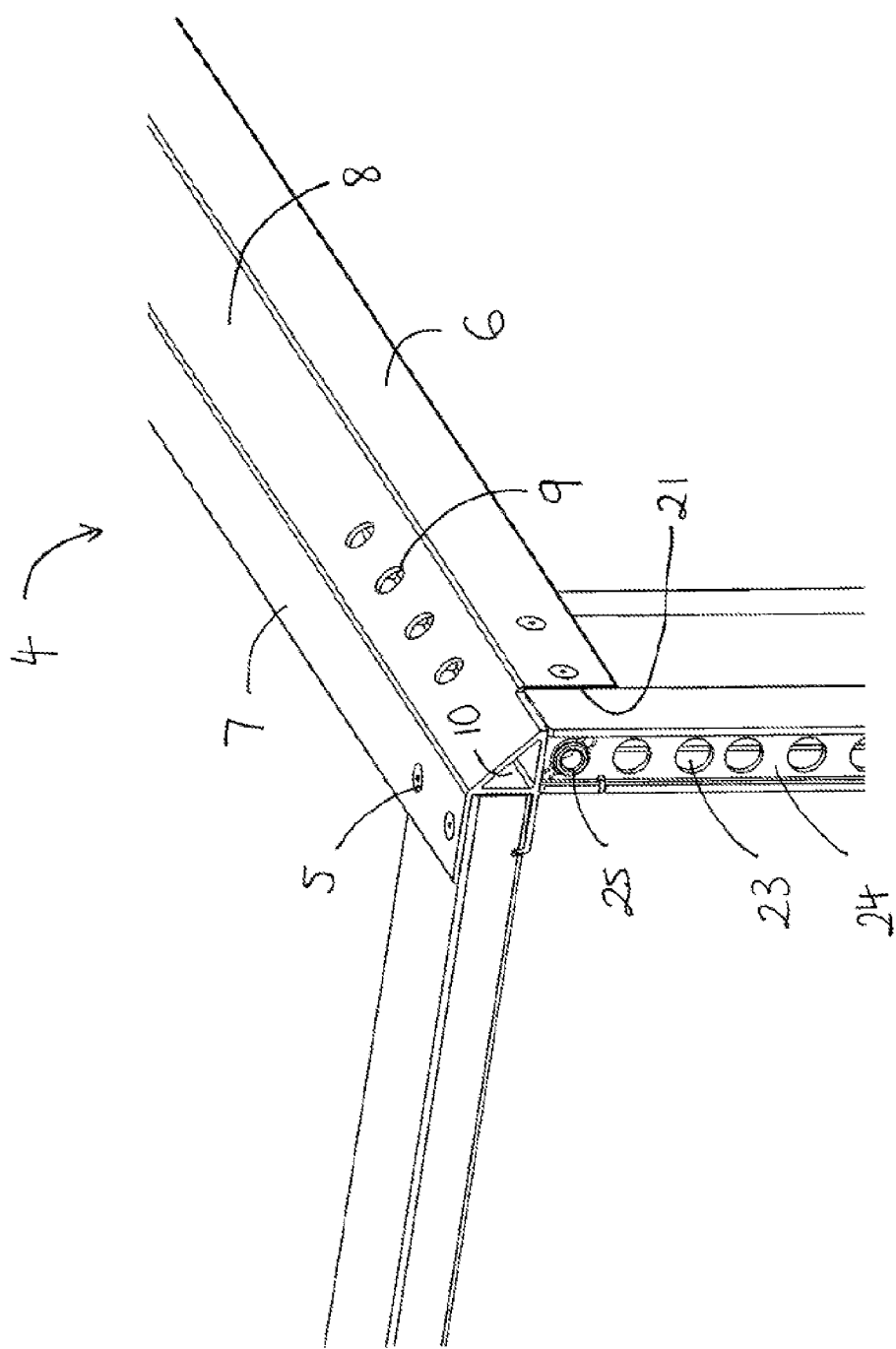
FIG. 2 shows an enlarged perspective view of a corner of the electronic rack and mounting chassis of FIG. 1.

The angled front to back wall/face provides a mounting surface for anti-vibration mounts, which may be formed from rubber, and are arranged to engage brackets on the inside of a rigid container, thereby suspending the chassis within the hollow interior thereof. In accordance with the angled front to back wall/face of each front to back chassis member 4, the anti-vibration mounts are preferably disposed at an angle of 45 degrees to the vertical and horizontal chassis members. Two or more anti-vibration mounts may be attached to each front to back member in spaced relation to one another in the front to back direction of the chassis (i.e. along the direction of the longitudinal axes of the front to back chassis members). A number of holes 9 are shown in FIG. 2, which are arranged to receive fixings of the anti-vibration mounts.

The front to back chassis members 4 each further comprise an inner vertical front to back wall 12 and an inner horizontal front to back wall 13, which extend parallel and in spaced relation to the outer vertical front to back wall 6 and the outer horizontal front to back wall 7, respectively. The arrangement is such that the inner and outer vertical front to back walls 6, 12 define a vertical channel 14 that extends along the direction of the longitudinal axis of each front to back chassis member and the inner and outer horizontal front to back walls 7, 13 define a horizontal channel 15 that extends along the direction of the longitudinal axis of each front to back chassis member. The channels are arranged to slidably/matingly receive an end of each of the vertical and horizontal members. The inner width dimension of each channel is substantially equal to a corresponding outer dimension of the end portion of the vertical or horizontal support member that it slidably receives. This is seen most clearly with reference to the horizontal chassis member 2 in FIG. 4, which has an outer vertical dimension A substantially equal to the inner vertical dimension B of the horizontal channel, at least in its portion received by the channel. The vertical chassis members have outer horizontal dimensions substantially equal to the inner horizontal dimensions of the horizontal channels, at least in their portion received by the channels.

Complementary mating means are provided to prevent all movement of the vertical and horizontal chassis members relative to the front to back chassis members other than in the direction of the longitudinal axes of the chassis members. The complementary mating means in the present invention comprise mating ribs 16 and grooves 17 that extend in the direction of the longitudinal axes of the front to back chassis members. In the present arrangement, the vertical and horizontal inner walls of the front to back chassis members 4 are provided with the ribs 14. Each of the inner walls is provided with an end portion that extends perpendicular to the remainder of the wall thereby forming one of the ribs 14, as seen most clearly in FIG. 4. Corresponding grooves 15 are provided in the vertical and horizontal chassis members. The complementary mating means is not to be limited as such. Various alternative mating means will be readily conceived by those skilled in the art.

In order to lock the chassis members together and prevent all movement, fasteners 5 are provided, which extend through the horizontal and vertical front to back walls of the front to back chassis members and into the vertical and horizontal chassis members. Corresponding holes 18, 19, 20 are provided in the front to back chassis members, the horizontal chassis members and the front to back chassis members. The fasteners 5 are preferably blind fasteners, which extend into but not through the vertical and horizontal chassis members. The ends of the blind fasteners preferably lie within hollow sections of the horizontal and vertical members. They may comprise any conventional fastener type used in the art, including but not limited to rivets, pins or threaded fasteners. It is preferable where fasteners that have heads are used, the heads are countersunk. There may be one, two or more fasteners provided at each end of all of the vertical and horizontal members.

The front and rear edges of the front to back chassis members preferably lie flush with the frontmost and rearmost faces/edges of the vertical and horizontal chassis members, as may be seen from FIG. 2.

Figure 3:
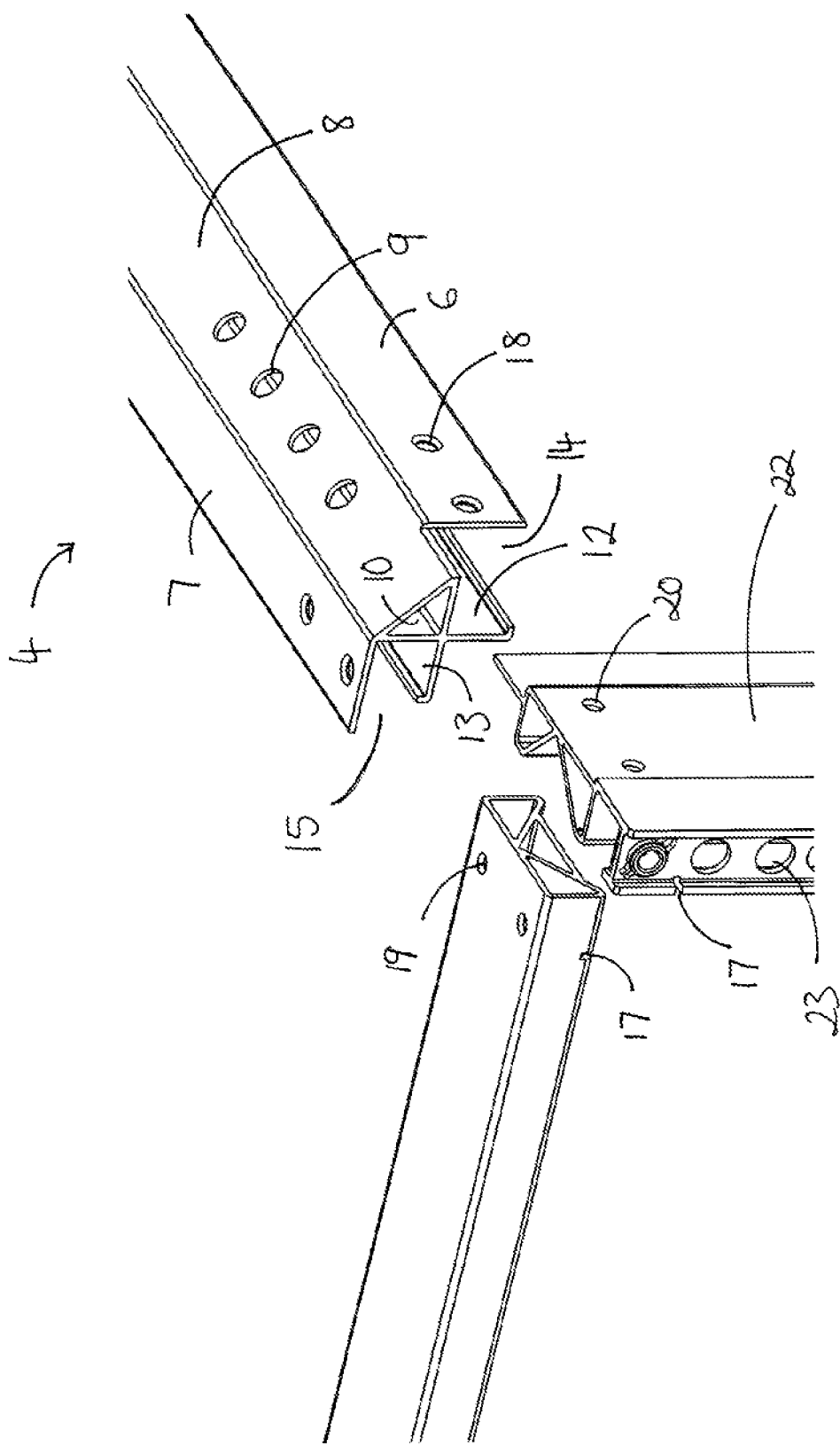
FIG. 3 shows the corner of FIG. 2 in an exploded perspective view.

The outer front to back faces 22 of the vertical members may have a stepped shape, as shown most clearly in FIG. 3, and the outer vertical front to back walls 6 may have a corresponding cutout portion 21. By this arrangement, the chassis may be provided with vertical outer faces that extend along the length of the chassis in the front to back direction as is clear from FIGS. 2 and 4.

Figure 8:
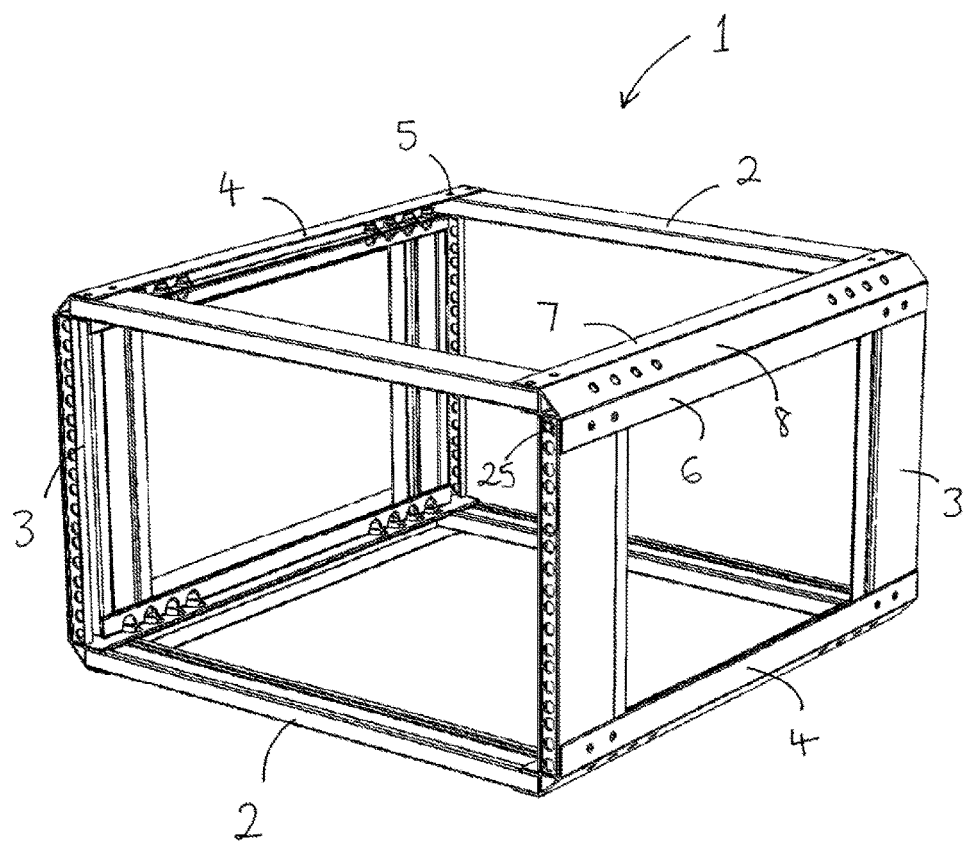
FIG. 8 shows an electronic rack and mounting chassis according to a second embodiment in perspective view.

Alternatively, as shown in the embodiment of FIG. 8, the inner front to back faces of the vertical members may have a stepped shape and the inner vertical front to back walls 12 may have a corresponding cutout portion. By this arrangement also, the chassis may be provided with vertical outer faces that extend along the length of the chassis in the front to back direction. Further suitable alternatives will be readily appreciated by those skilled in the art.

As shown in FIGS. 1 to 4, each of the vertical chassis members comprises a plurality of holes 23 for receiving fasteners for the fastening of equipment to the chassis. Each of the vertical chassis members preferably comprises a substantially planar wall 24 that is perpendicular to the direction of the longitudinal axes of the front to back chassis members, as shown. The holes 23 are provided in, and extend through, this wall.

The planar wall 24 of each vertical chassis member is preferably recessed from an outermost edge of the vertical chassis member in the direction of the longitudinal axes of the front to back chassis members, as shown. In the present arrangement front to back walls of the vertical chassis member project outwardly beyond the planar wall in the direction of the longitudinal axes of the front to back chassis members. By recessing the planar face 24 fastening means may be provided that are flush with or recessed from the outermost edge of the vertical chassis member.

A plurality of fasteners 25 will be used to fasten electronic equipment to the chassis. In the chassis of FIG. 1, three fasteners are shown. The number and positioning of fasteners will be entirely dependent on the equipment to be fixed within the chassis.

Figure 4:
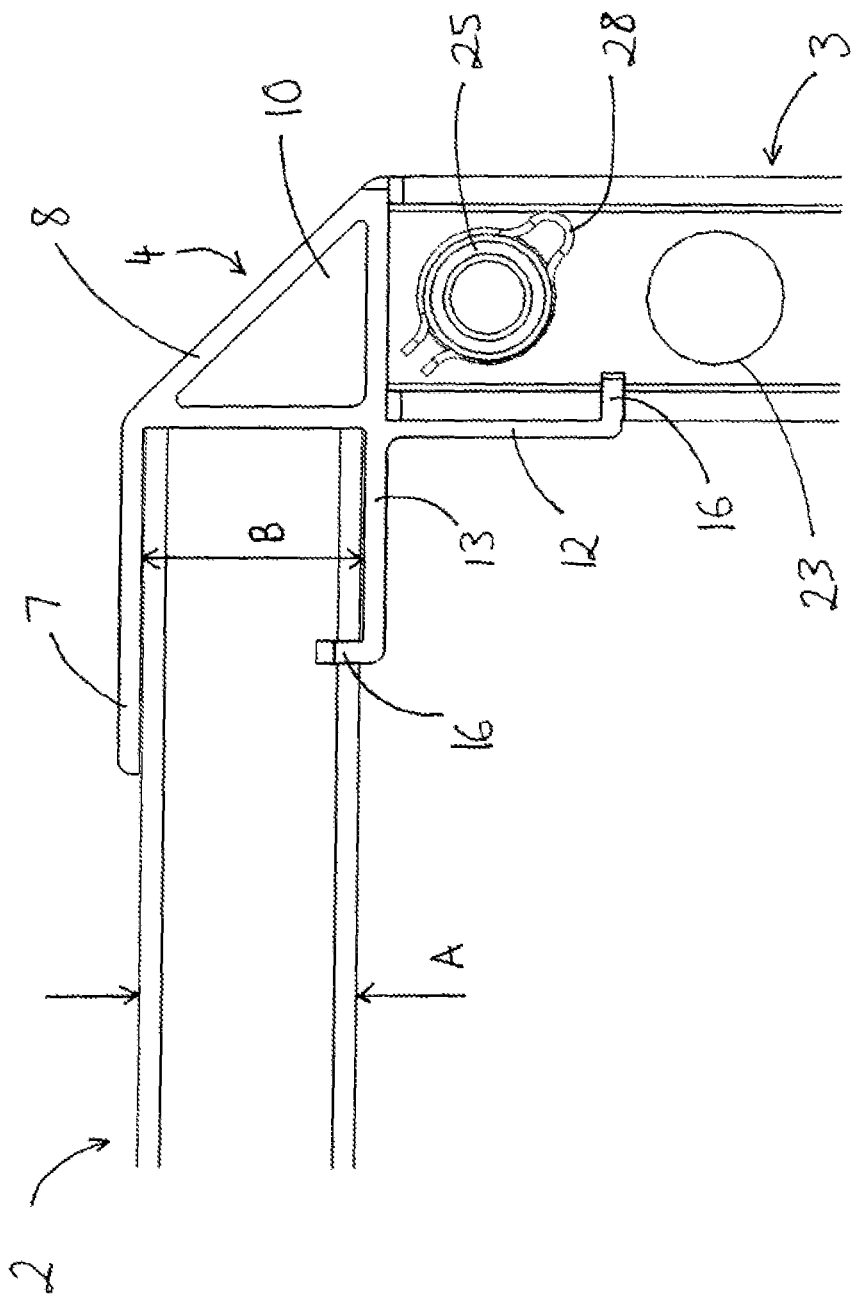
FIG. 4 shows an end elevation view of the corner of FIG. 2.

The fasteners may be seen most clearly in FIGS. 4 to 7. Each fastener 25 comprises a nut that is provided with a first portion 26 having a dimension greater than the diameter of the hole 23 that it is to be received by; and a second portion 27 that has a smaller diameter than the hole 23 so that it may extend therethrough. A locking member 28 is provided, which has a dimension greater than the hole 23 and is engageable with the second portion 27 to lock the nut in the hole. The locking member 28 preferably comprises a circlip, as seen in FIG. 4, which is received by a groove 30 in the second portion 27. Whilst a circlip is preferred and has been found to be highly effective, alternative locking means will, however, be possible. The nut has a central through hole, which is threaded to receive a suitable threaded fastener. In alternative arrangements the threaded hole may not extend through the nut. It may be a blind threaded hole.

The nut is preferably of unitary construction. Most preferably, machined from a single piece of material. The locking member is separately formed.

Whilst the first portion 26 is shown to be square, it need not be, so long as it has a dimension that is larger than the associated hole 23. It is, however, preferred to be square, since it may be received within a channel 31 on an inner face of the respective vertical chassis member, as seen in FIG. 7, to prevent rotation of the nut when inserting a threaded fastener. The second portion 27 is preferably substantially cylindrical. The second portion has a smaller diameter than the associated hole. The groove 30 preferably has a square profile, as seen in FIG. 6.

Figure 5:
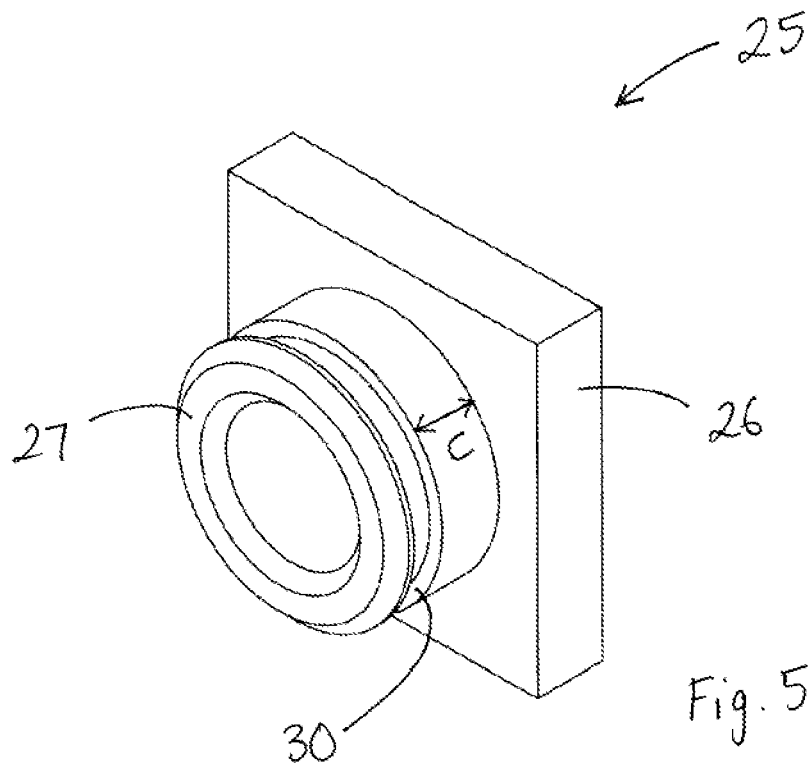
FIG. 5 shows a perspective view of a floating nut.
Figure 6:
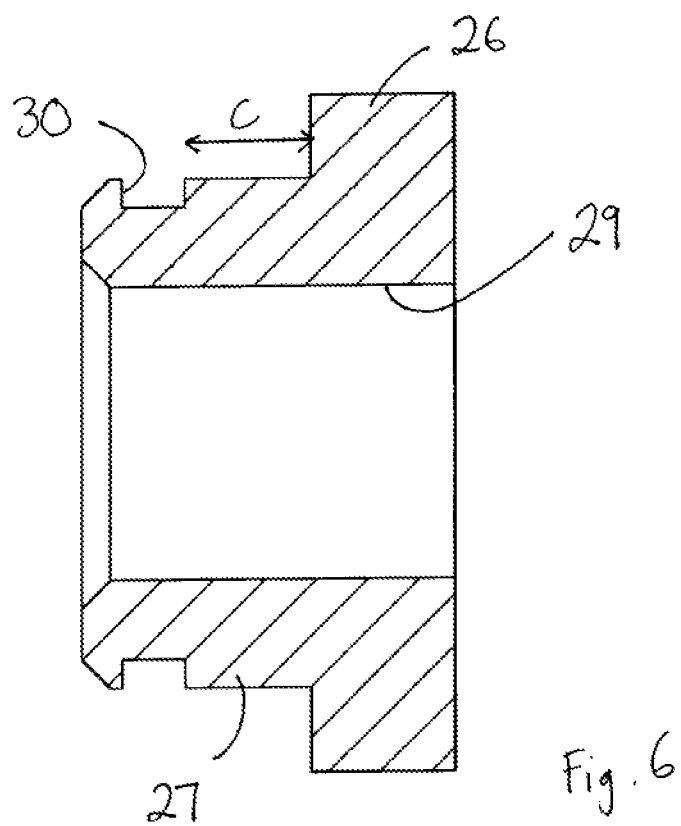
FIG. 6 shows a sectional view of the floating nut of FIG. 5.
Figure 7:
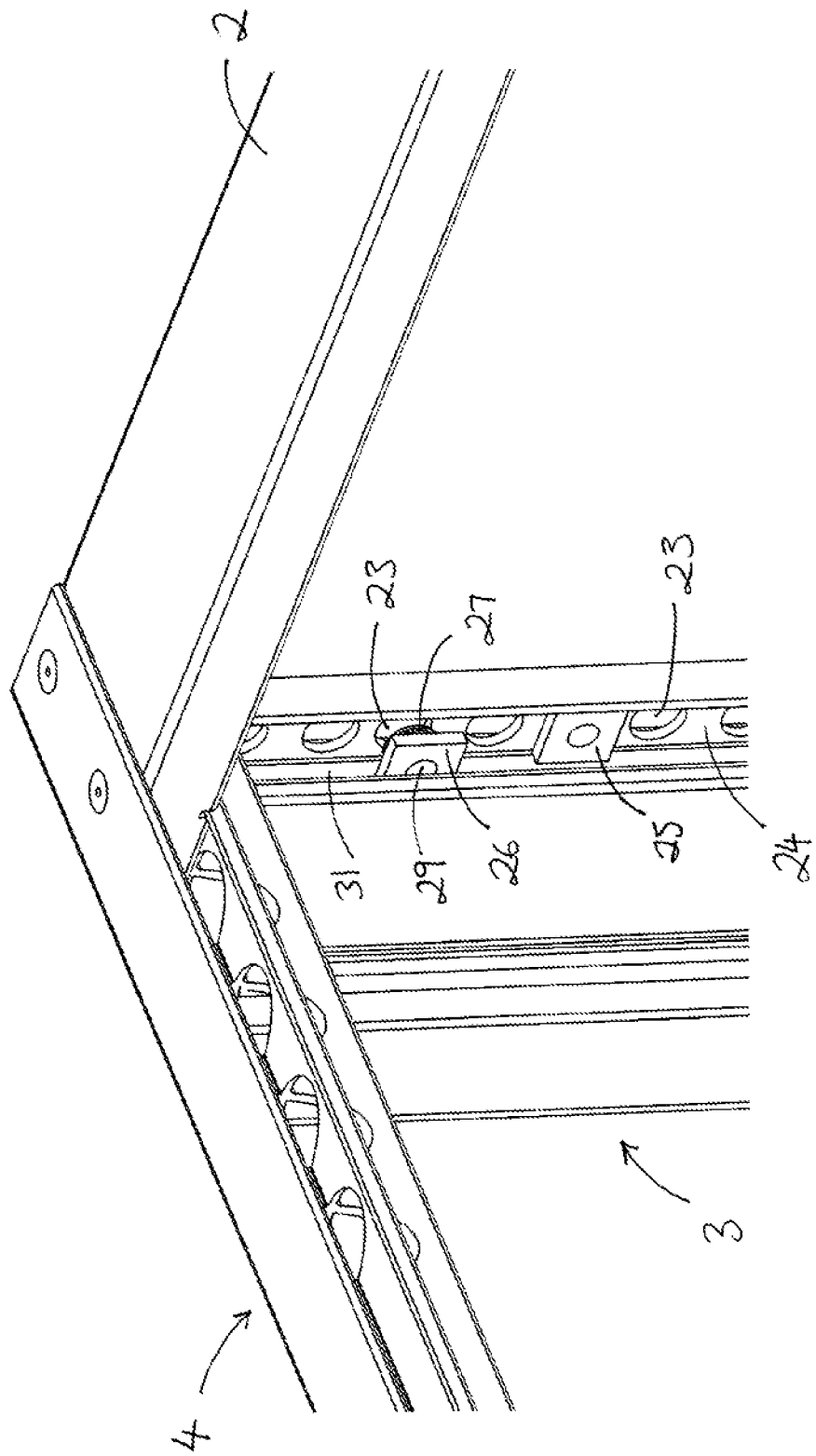
FIG. 7 shows a rear perspective view of the corner of FIG. 2 showing insertion of floating nuts in accordance with FIGS. 5 and 6.

The distance C, as marked in FIGS. 5 and 6, between the outer face/edge of the first portion 26 and the inner edge of the groove 30, in the axial direction of the nut, is preferably substantially equal to the thickness of the wall 24. It may be slightly larger but preferably not significantly so to limit axial movement when the nut is locked in the hole.

As may be seen in FIG. 7, the nuts are inserted from the inner face of the wall 24 so that the first portion 26 engages the inner face of the wall and the second portion extends outwards through the hole 23. With the circlip 28 received by the groove, as seen in FIG. 4, the nut 25 is trapped in the hole in a floating arrangement. Radial movement is possible to allow for alignment of the threaded hole in the nut with a bolt, since the diameter of the second portion 27 is smaller than the diameter of the hole 23 in which it is received. Axial movement is either not possible, or is very limited, since the first portion 26 and the circlip 28 sandwich the wall 24 therebetween. Any degree of axial movement may be controlled by variation of the distance C.

I claim:

1. An electronic rack and mounting chassis, comprising: a plurality of horizontal chassis members, each horizontal chassis member being comprised of a horizontal chassis hollow section extrusion having a horizontal chassis end and a horizontal chassis opposing end opposite said horizontal chassis end;

a plurality of vertical chassis members, each vertical chassis member being comprised of a vertical chassis hollow section extrusion having a vertical chassis end and a vertical chassis opposing end opposite said vertical chassis end; and a plurality of front to back chassis members, each front to back chassis member being comprised of a front to back hollow section extrusion, a horizontal channel on one side of said front to back hollow section extrusion, and a vertical channel on another side of said front to back hollow section extrusion, wherein at least one front to back chassis member connects to at least one horizontal chassis member and at least one vertical chassis member, wherein said horizontal channel extends along a longitudinal axis of a respective front to back chassis member, said horizontal channel receiving said horizontal chassis end of said horizontal chassis hollow section extrusion so as to lock said horizontal chassis member on at least one axis relative to said front to back chassis member and said vertical chassis member, wherein said vertical channel extends along said longitudinal axis of said respective front to back chassis, said vertical channel receiving said vertical chassis end of said vertical chassis hollow section extrusion so as to lock said vertical chassis member in at least one axis relative to said front to back chassis member and said horizontal chassis member, wherein said horizontal chassis hollow section extrusion is comprised of at least one hollow triangular section, and wherein said vertical chassis hollow section extrusion is comprised of at least one hollow triangular section.

2. The electronic rack and mounting chassis as claimed in claim 1, wherein said front to back hollow section extrusion is comprised of a hollow triangular section.

3. The electronic rack and mounting chassis as claimed in claim 1, further comprising:

a horizontal mating element on said inner horizontal front to back wall;

a complementary horizontal mating element on said horizontal chassis member, said horizontal mating element and said complementary horizontal mating element being cooperative to lock said horizontal chassis member on said longitudinal axis of said front to back chassis member;

a vertical mating element on said inner vertical front to back wall; and a complementary vertical mating element on said vertical chassis member, said vertical mating element and said complementary vertical mating element being cooperative to lock said vertical chassis member on said longitudinal axis of said front to back chassis member.

4. The electronic rack and mounting chassis as claimed in claim 1, further comprising:

a fastening element connecting said front to back chassis member to at least one of a group consisting of said vertical chassis member and said horizontal chassis member.

5. The electronic rack and mounting chassis as claimed in claim 4, wherein said fastening element being comprised of a blind fastener extending through said front to back chassis member and being within said at least one of a group consisting of said horizontal chassis member and said vertical chassis member.

6. The electronic rack and mounting chassis as claimed in claim 4, wherein said blind fasteners has an end within a respective horizontal chassis hollow section extrusion or respective vertical chassis hollow section extrusion.

7. An electronic rack and mounting chassis, comprising:

a plurality of horizontal chassis members, each horizontal chassis member being comprised of a horizontal chassis hollow section extrusion having a horizontal chassis end and a horizontal chassis opposing end opposite said horizontal chassis end;

a plurality of vertical chassis members, each vertical chassis member being comprised of a vertical chassis hollow section extrusion having a vertical chassis end and a vertical chassis opposing end opposite said vertical chassis end; and a plurality of front to back chassis members, each front to back chassis member being comprised of a front to back hollow section extrusion, a horizontal channel on one side of said front to back hollow section extrusion, and a vertical channel on another side of said front to back hollow section extrusion, wherein at least one front to back chassis member connects to at least one horizontal chassis member and at least one vertical chassis member, wherein said horizontal channel extends along a longitudinal axis of a respective front to back chassis member, said horizontal channel receiving said horizontal chassis end of said horizontal chassis hollow section extrusion so as to lock said horizontal chassis member on at least one axis relative to said front to back chassis member and said vertical chassis member, wherein said vertical channel extends along said longitudinal axis of said respective front to back chassis, said vertical channel receiving said vertical chassis end of said vertical chassis hollow section extrusion so as to lock said vertical chassis member in at least one axis relative to said front to back chassis member and said horizontal chassis member, and wherein said horizontal channel is comprised of an inner horizontal front to back wall and an outer horizontal front to back wall, said outer horizontal front to back wall being longer than said inner horizontal front to back wall, and wherein said vertical channel is comprised of an inner vertical front to back wall and an outer vertical front to back wall, said outer vertical front to back wall being longer than said inner vertical front to back wall.

8. The electronic rack and mounting chassis as claimed in claim 7, wherein said horizontal chassis end of said horizontal chassis hollow section extrusion is slidably received in said horizontal channel and rotatably locked on said longitudinal axis of said front to back chassis member against said outer horizontal front to back wall, and wherein said vertical chassis end of said vertical chassis hollow section extrusion is slidably received in said vertical channel and rotatably locked on said longitudinal axis of said front to back chassis member against said outer vertical front to back wall.

9. The electronic rack and mounting chassis as claimed in claim 7, wherein said horizontal chassis end of said horizontal chassis hollow section extrusion is slidable along said longitudinal axis of said front to back chassis member, and wherein said vertical chassis end of said vertical chassis hollow section extrusion is slidable along said longitudinal axis of said front to back chassis member.

10. An electronic rack and mounting chassis, comprising:
a plurality of horizontal chassis members, each horizontal chassis member being comprised of a horizontal chassis hollow section extrusion having a horizontal chassis end and a horizontal chassis opposing end opposite said horizontal chassis end;
a plurality of vertical chassis members, each vertical chassis member being comprised of a vertical chassis hollow section extrusion having a vertical chassis end and a vertical chassis opposing end opposite said vertical chassis end;
a plurality of front to back chassis members, each front to back chassis member being comprised of a front to back hollow section extrusion, a horizontal channel on one side of said front to back hollow section extrusion, and a vertical channel on another side of said front to back hollow section extrusion,
wherein at least one front to back chassis member connects to at least one horizontal chassis member and at least one vertical chassis member,
wherein said horizontal channel extends along a longitudinal axis of a respective front to back chassis member, said horizontal channel receiving said horizontal chassis end of said horizontal chassis hollow section extrusion so as to lock said horizontal chassis member on at least one axis relative to said front to back chassis member and said vertical chassis member, and
wherein said vertical channel extends along said longitudinal axis of said respective front to back chassis, said vertical channel receiving said vertical chassis end of said vertical chassis hollow section extrusion so as to lock said vertical chassis member in at least one axis relative to said front to back chassis member and said horizontal chassis member;
a plurality of holes on said vertical chassis member; and
fasteners, each fastener corresponding to a respective hole of said plurality of holes and being comprised of a nut having a first portion, a second portion, and a locking member, said first portion having a dimension greater than a diameter of said respective hole, said second portion having a dimension smaller than said diameter of said respective hole, said locking member having a dimension greater than said diameter of said respective hole and being engageable with said second portion so as to lock said nut in said respective hole.

11. The electronic rack and mounting chassis as claimed in claim 10, wherein said locking member prevents axial movement of the nut, said nut having limited radial movement.

12. The electronic rack and mounting chassis as claimed in claim 10, wherein the locking member comprises a circlip.

13. The electronic rack and mounting chassis as claimed in claim 12, wherein the circlip is received by a groove in said second portion.

14. The electronic rack and mounting chassis as claimed in claim 10, wherein spacing between said locking member and said first portion in an axial direction of said nut is equal to thickness of said respective hole in said vertical chassis member.

15. The electronic rack and mounting chassis as claimed in claim 10, wherein an outermost edge of said second portion is flush with or recessed from an outermost edge of said vertical chassis member.

16. The electronic rack and mounting chassis as claimed in claim 10, wherein said first portion is non-round.

17. The electronic rack and mounting chassis as claimed in claim 16, further comprising: an engagement means for said vertical chassis member and said first portion, said vertical chassis member preventing rotation of said nut.

* * * * *